United States Patent
Heber et al.

(10) Patent No.: US 11,829,051 B2
(45) Date of Patent: Nov. 28, 2023

(54) METHOD AND ARRANGEMENT FOR INFLUENCING LIGHT PROPAGATION DIRECTIONS

(71) Applicant: siOPTICA GmbH, Jena (DE)

(72) Inventors: André Heber, Weimar (DE); Andreas Bregulla, Duderstadt (DE)

(73) Assignee: siOPTICA GmbH, Jena (DE)

( * ) Notice: Subject to any disclaimer, the term of this patent is extended or adjusted under 35 U.S.C. 154(b) by 1 day.

(21) Appl. No.: 17/759,732

(22) PCT Filed: Mar. 25, 2021

(86) PCT No.: PCT/EP2021/057786
§ 371 (c)(1),
(2) Date: Jul. 29, 2022

(87) PCT Pub. No.: WO2021/191370
PCT Pub. Date: Sep. 30, 2021

(65) Prior Publication Data
US 2023/0104398 A1     Apr. 6, 2023

(30) Foreign Application Priority Data
Mar. 26, 2020 (DE) ..................... 10 2020 002 053.4

(51) Int. Cl.
*G02F 2/02* (2006.01)
(52) U.S. Cl.
CPC ............ *G02F 2/02* (2013.01); *G02F 2202/36* (2013.01); *G02F 2203/01* (2013.01); *G02F 2203/05* (2013.01)

(58) Field of Classification Search
None
See application file for complete search history.

(56) References Cited

U.S. PATENT DOCUMENTS

| | | |
|---|---|---|
| 2007/0030240 A1 | 2/2007 | Sumiyoshi et al. |
| 2012/0299045 A1 | 11/2012 | Pan et al. |
| 2016/0377920 A1 | 12/2016 | Park et al. |

(Continued)

FOREIGN PATENT DOCUMENTS

| | | |
|---|---|---|
| DE | 10 2010 006 280 A1 | 8/2011 |
| DE | 10 2016 206 681 B3 | 8/2017 |
| JP | 5816115 B2 | 11/2015 |

*Primary Examiner* — Darryl J Collins
*Assistant Examiner* — Tamara Y. Washington
(74) *Attorney, Agent, or Firm* — Christensen, Fonder, Dardi & Herbert PLLC

(57) ABSTRACT

A method for influencing light propagation directions of a light-emitting surface emitting light of a first wavelength range in a first direction and light of a second and wavelength range in a second direction. The wavelength ranges have a wavelength-dependent spectral radiance and differ in a peak wavelength. A switchable color converter is arranged in front of the light-emitting surface. The method includes the steps of a) deactivating the color converter for a first mode so that the second-wavelength range is transmitted and the first-wavelength range is absorbed, such that light from the light-emitting surface is only perceptible from the second direction, or b) activating the color converter for a second mode so that light of the first-wavelength range is converted into light of the second-wavelength range and light of the second-wavelength range is transmitted, such that light from the light-emitting surface is perceptible from both directions.

12 Claims, 4 Drawing Sheets

(56) References Cited

U.S. PATENT DOCUMENTS

2018/0113341 A1 4/2018 Lee et al.
2018/0341130 A1 11/2018 Kim et al.
2019/0171061 A1 6/2019 Lee et al.
2019/0348585 A1 11/2019 Woodgate et al.

Prior art

METHOD AND ARRANGEMENT FOR INFLUENCING LIGHT PROPAGATION DIRECTIONS

PRIORITY CLAIM

The present application is a National Phase entry of PCT Application No. PCT/EP2021/057786, filed Mar. 25, 2021, which claims priority from German Patent Application No. 10 2020 002 053.4, filed Mar. 26, 2020, the disclosures of which are hereby incorporated by reference herein in their entirety.

FIELD OF THE INVENTION

The invention is directed to methods and arrangements for influencing light propagation directions.

BACKGROUND OF THE INVENTION

In recent years, OLED panels possessing visual angles of outstanding width have been used increasingly for displaying image content. However, there are often situations in which this very large viewing area in a display screen can be a disadvantage. Increasingly, information such as bank data or other personal information and sensitive data is also available on mobile devices, such as notebooks, tablets and mobile phones. Accordingly, people need to supervise viewing access to these sensitive data. They should be able to choose a wide viewing angle for sharing information on a display with others, e.g., when viewing vacation photographs or for advertising purposes. On the other hand, they need a small viewing angle when they want to treat the displayed information confidentially.

There is currently no commercially available method for OLED display screens which allows viewing angles to be switched and offers darkening in the restricted viewing angle for viewing from side angles.

A similar problem arises in automotive engineering. In this case, the driver must not be distracted by image content, e.g., digital entertainment programs, when the engine is operating, but the passenger would like to view this image content also during driving. Consequently, there is a need for a display screen which can switch between the corresponding display modes so that image content can be made visible selectively to the passenger alone or to driver and passenger simultaneously.

Add-on films based on microlouvers have already been used for mobile displays to protect visual data. However, these films could not be switched or switched around, they always had to be manually applied first and then removed again subsequently. Also, they have to be carried separately from the display when not in immediate use. A further substantial drawback in using such louvered films is connected to the light losses entailed.

US 2007/030240 A1 describes an optical element for controlling the light propagation direction of light originating from a backlight illumination. This optical element requires, for example, liquid crystals in the form of PDLCs, which is expensive on the one hand and, on the other hand, poses a safety risk especially for consumer applications because PDLC liquid crystals generally require voltages higher than 60 V for their circuitry.

DE 102016206681 B3 describes the arrangement and respective construction of two organic light-emitting diodes (OLEDs). The two OLEDs differ in their emitting characteristic: one OLED emits substantially in on-axis viewing angles and the other OLED emits substantially in off-axis viewing angles. This arrangement has the disadvantage that two organic light-emitting diodes must be produced one above the other and an additional electrode in the LED must be controlled.

SUMMARY OF THE INVENTION

Therefore, it is the object of the invention to describe a method and an arrangement for influencing light propagation directions. The invention is to be applicable particularly for OLED pixels or OLED display screens and will permit operating modes for public viewing and restricted viewing. Further, the invention is to be inexpensively implementable and universally usable with diverse types of display screen in order to enable switching between a private viewing mode and a public viewing mode in such a way that the resolution of such a display screen is not significantly reduced.

The above-stated object is met according to the invention by a method for influencing the light propagation directions of at least one light-emitting surface F, which light-emitting surface F emits light of a first wavelength range $\Delta\lambda_1$ in a first spatial direction R1 and light of a wavelength range $\Delta\lambda_2$ at least partially differing from the first wavelength range $\Delta\lambda_1$ in a spatial direction R2 differing from the first spatial direction R1, the wavelength ranges $\Delta\lambda_1$ and $\Delta\lambda_2$ have a wavelength-dependent spectral radiance and differ (but otherwise can also partially overlap) at least in a peak wavelength, and a switchable color converter which, in the deactivated state, absorbs light of shorter wavelengths and at the same time transmits light of longer wavelengths and which, in the activated state, converts light of shorter wavelength into light of longer wavelengths and transmits light of longer wavelengths is arranged in front of the aforementioned light-emitting surface F with reference to viewing direction, the method comprising the following steps:

deactivating the color converter for a first mode so that light of the second wavelength range $\Delta\lambda_2$ is transmitted and light of the first wavelength range $\Delta\lambda_1$ is absorbed, by means of which the light emanating from the light-emitting surface F is only perceptible from the second viewing direction R2, or activating the color converter for a second mode so that light of the first wavelength range $\Delta\lambda_1$ is at least partially converted into light of the second wavelength range $\Delta\lambda_2$ and light of the second wavelength range $\Delta\lambda_2$ is transmitted, by means of which the light emanating from the light-emitting surface F is perceptible from both spatial directions R1, R2.

With regard to the manner of functioning, it is noted that the color converter absorbs light of shorter wavelength of the first wavelength range $\Delta\lambda_1$ when it is not activated. At the same time, it lets pass light of larger wavelength $\Delta\lambda_2$. However, if the color converter is activated, it converts light of shorter wavelength into light of longer wavelengths and lets it pass without significantly influencing the propagation direction of this light. At the same time, the color converter enlarges the wavelengths of the light passing through it substantially independent from the wavelength itself.

Each wavelength range $\Delta\lambda_1$ or $\Delta\lambda_2$ can have one or more peaks with respect to spectral radiance distributed over the visible spectrum. In case the wavelength range $\Delta\lambda_1$ has a peak, it will preferably have a shorter wavelength than the peak of wavelength range $\Delta\lambda_2$.

It should also be noted, without limiting generality, that wavelength range $\Delta\lambda_1$ is emitted in spatial direction R1 and wavelength range $\Delta\lambda_2$ is emitted in spatial direction R2 in the above-described method according to the invention. This association shall also apply in the following embodiments of the invention. It will be appreciated that R1 and R2 could also be interchanged without departing from the scope of the invention.

"Spatial direction" R1 or R2 means, of course, a solid angle spreading out in one or two planes and comprising a few to some degrees in each plane. However, it is also possible that, e.g., a spatial direction R1 is outwardly cone-shaped but a second conical shape is cut out inside of this cone, for example, that of a second spatial direction R2, so that both spatial directions R1 and R2 together give a total conical shape. Correspondingly, a plurality of spatial directions together gives a larger solid angle. The fact that the spatial directions R1 and R2 differ need not mean that they can also have a certain overlap. However, in the area of the overlap, the method described above does not afford an extensive influence on the propagation directions of the light emitted by the light-emitting surface F.

The light-emitting surface F generally forms the uppermost surface of a layer body, for example, of an OLED pixel, from which light is emitted with a predetermined or predeterminable emitting characteristic. In the case of such self-luminous diodes, the light-emitting surface, which is actually illuminated from below the surface, is also referred to as self-luminous for the sake of simplicity even when further layers, for example, a semitransparent electrode or a substrate layer, are located between the uppermost emitter layer and the light-emitting surface, also referred to as emitting surface. However, the light-emitting surface F can also be illuminated by other means. In such a case, the light-emitting surface F is also referred to as "illuminated", for example, in the case of the surface of an LCD panel which is backlit by backlighting illumination.

The spectral radiance of each of the wavelength ranges varies depending on the wavelength over the respective range. That wavelength in which spectral radiance on the light-emitting surface is highest is also referred to as peak wavelength. A wavelength range can also have a plurality of peak wavelengths, which is then a case local maxima of the spectral radiance.

The switchable color converter can preferably be formed by means of quantum dots. There is a multitude of quantum dots for each color converter. Each quantum dot can have, for example, a spatial extent of a maximum of 100 nm, preferably a maximum of 50 nm, particularly preferably a maximum of 20 nm. Semiconductor nanocrystals, for example, are contemplated as materials for the quantum dots, such as: CdSe, CdS, CdTe, ZnSe, ZnTe, ZnS, HgTe, InAs, InP, GaAs, GaP, GaInP 2, HgS, HgSe, HgTe, CdSeS, CdSeTe, CdSTe, ZnSeS, ZnSeTe, ZnSTe, HgSeS, HgSeT, CdZn CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSeS, HgZnSeSe, HgZnSeS, GaN, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInPAs, InAlNP, InAlNAs, and/or InAlPAs. Doped graphenes, silicon and synthetic perovskites are also contemplated. Other configurations are possible.

In order to achieve full color in both modes, there are preferably pairs of wavelength ranges within wavelength ranges $\Delta\lambda_1$ and $\Delta\lambda_2$ for each of the three primary colors—red, green and blue—such as violet-blue, blue-green and green-red. A full-color separation of this kind is known to the person skilled in the art from Dolby™ 3D glasses or from the corresponding interference filter technology in which a light filter separates the light of the primary colors, red, green and blue, into two different wavelength ranges, respectively. This principle may also be applied in a corresponding manner within the framework of the invention. An incomplete absorption of the color converter can be compensated by adding suitable color filters.

By "pair of wavelength ranges" is meant that of two peaks lying close together in the spectrum ("close" means that they are several nanometers up to approximately 200 nm, preferably up to 100 nm, apart), one peak lies in wavelength range $\Delta\lambda_1$ and one peak lies in wavelength range $\Delta\lambda_2$. If, as was described above, there are three pairs for a full-color display, this means accordingly that the corresponding three peaks in wavelength range $\Delta\lambda_1$ do not occur identically in wavelength range $\Delta\lambda_2$ but rather are contained therein so as to be displaced in its spectrum by several nanometers up to about 200 nm, preferably up to 100 nm. A slight overlapping within the pairs is left out of consideration here.

In case of the above-described use of full color, two or three or possibly even more such color converters can be provided depending on configuration.

It may be helpful for particular cases of configuration that the switchable color converter does not cover the entire self-luminous or illuminated light-emitting surface F but rather only a strict subarea thereof.

Further, it is advantageous when the switchable color converter is deactivated by applying an electric field and is activated in the absence of an electric field.

Further, there is preferably provided a multitude of self-luminous light-emitting surfaces F, each of which corresponds to an emitting surface of a smallest pixel of a QLED display, OLED display, mini-LED display, LED display or micro-LED display, which smallest pixel is formed as a layer body. Smallest pixels can be color subpixels (e.g., red, green, blue) or monochromatic pixels or full-color enabled pixels depending on the construction of the imaging device. Also contemplated are LCD-type, SED-type, FED-type or other types of display screen whose smallest pixels correspond to the multitude of self-luminous light-emitting surfaces F. The pixels or subpixels are preferably of the same size but can also have different dimensions collectively or even individually.

Beyond this, it is possible that, further, in the layer body of a smallest pixel of this kind there is an electro-optical component which changes an emitting characteristic of the light-emitting surface F and which is preferably formed as a distributed Bragg reflector (DBR), semitransparent mirror, waveplate, liquid crystal layer, electrochromic layer, electrowetting element, switchable absorber or as phase-change material, also known as phase shifting element, so that, at least in the first spatial direction R1, light of the first wavelength range $\Delta\lambda_1$ is emitted instead of light of wavelength range $\Delta\lambda_2$. It is important in this respect that the light of the second wavelength range $\Delta\lambda_2$ is collimated, i.e., limited to certain propagation directions R2. In case of an OLED-based light-emitting surface F, the emitting characteristic can be modified, for example, by varying a resonance condition of the OLED. In case of a QLED, the spontaneous emission in the thin-film resonator is shifted to stimulated emission by varying the resonance condition and, in this way, influence is exerted on the emitting characteristic.

In this variant of the invention, as in all of the following variants, a restricted viewing mode does not necessarily mean that no light at all is emitted in certain directions. On the contrary, a certain residual light can also be emitted, although it hampers comfortable viewing. Typical values for such residual light (measured as luminance) in zones provided for restricted viewing are a few percent (e.g., 1% to, at most, 5%) of the peak value which is perceptible from the dedicated viewing zone of the unrestricted viewing area.

The above-stated object of the invention is further met by a second method for influencing the light propagation directions of at least one light-emitting surface F, in which:

in a first mode, the aforementioned light-emitting surface F selectively emits light of a first wavelength range $\Delta\lambda_1$ in a first spatial direction R1 and light of a second wavelength range $\Delta\lambda_2$ at least partially differing from the first wavelength range $\Delta\lambda_1$ in a second spatial direction R2 differing from the first spatial direction R1, or, in a second mode, emits light at least of the second wavelength range $\Delta\lambda_2$ in both spatial directions R1, R2, the wavelength ranges $\Delta\lambda_1$ and $\Delta\lambda_2$ have a wavelength-dependent spectral radiance and differ (but otherwise can also partially overlap) at least in a peak wavelength, and at least one color filter which absorbs light of wavelength range $\Delta\lambda_1$ and transmits light of wavelength range $\Delta\lambda_2$ is arranged in front of the aforementioned light-emitting surface F with reference to viewing direction, this method comprising the following steps:

activating the first mode in which light of the second wavelength range $\Delta\lambda_2$ after passing through the color filter is only perceptible from the second spatial direction R2, or activating the second mode in which light of the second wavelength range $\Delta\lambda_2$ after passing through the color filter is perceptible from both spatial directions R1, R2.

Particularly preferably, in the first mode the light of wavelength range $\Delta\lambda_2$ is collimated, i.e., the spatial direction R2 comprises a rather narrow cone, such as with opening angles of 30 degrees maximum, and in the second mode the light is not collimated, i.e., the spatial directions R1 and R2 complement each other to form a wide solid angle with at least one opening angle of greater than 40 degrees.

There is advantageously provided a multitude of self-luminous light-emitting surfaces F, each of which corresponds to an emitting surface of a smallest pixel of a QLED display, OLED display, mini-LED display, LED display or micro-LED display, which smallest pixel is formed as a layer body.

Further, in a layer body of each light-emitting surface F arranged under the light-emitting surface F, there is an electro-optical component which varies the resonance condition in the aforementioned layer body and which is preferably formed as a distributed Bragg reflector (DBR), semi-transparent mirror, waveplate, liquid crystal layer, electrochromic layer, electrowetting element, switchable absorber or as phase-change material (also known as phase shifting element) by which the collimation of light of wavelength range $\Delta\lambda_2$ can be switched on and off. This means nothing other than that the emitting characteristic for each light-emitting surface F is influenced by means of the respective electro-optical component in a first mode such that light of at least partially different wavelength ranges $\Delta\lambda_1$ and $\Delta\lambda_2$ is emitted in different spatial directions R1, R2 and, in a second mode, light of at least one wavelength range $\Delta\lambda_2$ is emitted in spatial directions R1, R2. This in turn causes light of wavelength range Ali to be emitted outside of the dedicated viewing zone, i.e., of spatial direction R2 in the first mode, but absorbed by the color filter. In other words, the light exiting from the light-emitting surface F in spatial direction(s) R1 is converted in color between the two modes, i.e., it is possible to switch between the emission of light of wavelength range $\Delta\lambda_1$ and of wavelength range $\Delta\lambda_2$ in spatial direction R1. With OLEDs, this is accomplished, for example, by switching between a resonant state and a non-resonant state. In the non-resonant state, light of the same wavelength is emitted in all spatial directions R1, R2. In the resonant state, which corresponds to the first mode, the wavelength changes with the viewing angle or solid angle so that light is only perceptible in the second spatial direction R2 because of the color filter.

There is preferably at least one pair of inner wavelength ranges within the first wavelength range $\Delta\lambda_1$ and second wavelength range $\Delta\lambda_2$ for each of the three primary colors red, green and blue for a full color display. For each pair of inner wavelength ranges, one of two peaks in the spectrum which are separated by several nanometers to several tens of nanometers and up to a maximum of approximately 200 nm, lies in the first wavelength range Ali and the other lies in the second wavelength range $\Delta\lambda_2$.

The invention acquires special significance in the application of the above-described method for generating a first operating state B1 for a restricted viewing mode and a second operating state B2 for a public viewing mode in a display screen whose smallest pixels have electro-optical components and light-emitting surfaces F as was described at length above. The switchable color converter is deactivated for generating the first operating mode B1 and is activated for generating the second operating mode B2.

The object of the invention is further met by an arrangement for influencing the light propagation directions of at least one self-luminous or illuminated light-emitting surface F, where the aforementioned light-emitting surface F emits (for example, when the light-emitting surface F is a pixel of a resonant OLED display screen) light of a first wavelength range $\Delta\lambda_1$ in a first spatial direction R1 and light of a second wavelength range $\Delta\lambda_2$ at least partially differing from the first wavelength range $\Delta\lambda_1$ in a second spatial direction R2 differing from the first spatial direction R1, which wavelength ranges $\Delta\lambda_1$ and $\Delta\lambda_2$ have a wavelength-dependent spectral radiance and differ at least in a peak wavelength (but can otherwise also partially overlap), the arrangement further comprising a switchable color converter which is arranged in front of the aforementioned light-emitting surface F with respect to viewing direction and which preferably comprises quantum dots, wherein:

the color converter is deactivated for a first mode so that light of the second wavelength range $\Delta\lambda_2$ is transmitted and light of the first wavelength range $\Delta\lambda_1$ is absorbed, as a result of which the light emanating from the light-emitting surface F is only perceptible from the second spatial direction R2, and the color converter is activated for a second mode so that light of the first wavelength range $\Delta\lambda_1$ is at least partially converted into light of the second wavelength range $\Delta\lambda_2$ and light of the second wavelength range $\Delta\lambda_2$ is transmitted, as a result of which the light emanating from the light-emitting surface F is perceptible from both spatial directions R1, R2.

The switchable color converter is generally deactivated by applying an electric field and activated in the absence of an electric field.

Lastly, the object of the invention is met by an arrangement for influencing the light propagation directions of at least one self-luminous or illuminated light-emitting surface F of a first wavelength range $\Delta\lambda_1$ in a first spatial direction R1 and light of a second wavelength range $\Delta\lambda_2$ at least partially differing from the first wavelength range $\Delta\lambda_1$ is emitted in a second spatial direction R2 differing from the first spatial direction R1 and, in a second mode, light of at least the second wavelength range $\Delta\lambda_2$ is emitted in both spatial directions R1, R2 (e.g., the light-emitting surface F can correspond to the emitting surface of a pixel of an OLED display screen in which laterally emitted light has a shorter wavelength), and the wavelength ranges $\Delta\lambda_1$ and $\Delta\lambda_2$ have a wavelength-dependent spectral radiance and differ at least in a peak wavelength (but can otherwise also partially overlap), the arrangement further comprising at least one color filter which is arranged in front of the aforementioned light-emitting surface F with respect to viewing direction and which absorbs light of the first wavelength range $\Delta\lambda_1$ and transmits light of the second wavelength range $\Delta\lambda_2$, wherein the first mode is activated, wherein light of the second wavelength range $\Delta\lambda_2$ is transmitted by the color filter and light of the first wavelength range $\Delta\lambda_1$ is absorbed by the color filter, as a result of which the light emanating from the light-emitting surface F after passing through the color filter is only perceptible from the second spatial direction R2, or the second mode is activated, wherein light of the second wavelength range $\Delta\lambda_2$ is transmitted by the color filter, as a result of which the light emanating from the light-emitting surface F after passing through the color filter is perceptible from both spatial directions R1, R2.

The above-mentioned arrangement can advantageously be expanded in that, further, a switchable distributed Bragg reflector (DBR), a switchable mirror and/or a switchable waveplate is provided in the layer body of each self-luminous or illuminated light-emitting surface F such that the emission of light of wavelength range $\Delta\lambda_1$ can be switched on and off. In particular, the switchable DBR can ensure that the light-emitting surface F emits light of the two at least partially different wavelength ranges $\Delta\lambda_1$ and $\Delta\lambda_2$ in different spatial directions R1, R2 in the first mode and emits light of at least the second wavelength range $\Delta\lambda_2$ in spatial directions R1, R2 in a second mode.

The above-mentioned configuration variants and interrelationships of means and effect of the method apply analogously here and are not described again in order to avoid repetition.

The performance of the invention is basically retained when the above-described parameters are varied within certain limits.

It will be understood that the features mentioned above and those yet to be explained below may be used not only in the stated combinations but also in other combinations or alone without departing from the scope of the present invention.

BRIEF DESCRIPTION OF THE DRAWINGS

The invention will be explained in more detail in the following with reference to drawings which also disclose key features of the invention. The drawings show.

DETAILED DESCRIPTION OF THE DRAWINGS

The drawings are not to scale and are merely schematic depictions.

Figure 1:
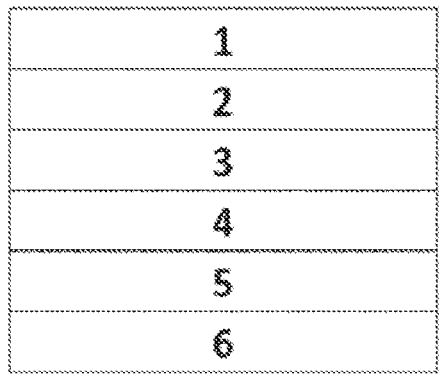
FIG. 1 the schematic diagram of the construction of a prior art OLED pixel.

FIG. 1 shows the schematic diagram of the construction of the layer body of a prior art OLED pixel. Located below a transparent substrate 1 (e.g., of glass or a polymer) in viewing direction is a semitransparent first electrode 2, for example, an anode, an organic layer 3 followed by an emissive layer 4 and, under the latter, another organic layer 5 and, finally, a mirror with a second electrode 6, for example, a cathode. In general, the organic layers 3 and 5 in the layer body in particular can be appreciably more complex. This embodiment with (at least) one OLED pixel as (self-luminous) light-emitting surface F makes use of the fact that light from OLEDs toward lateral emitting angles has a shorter wavelength than perpendicularly emitted light.

Figure 2:
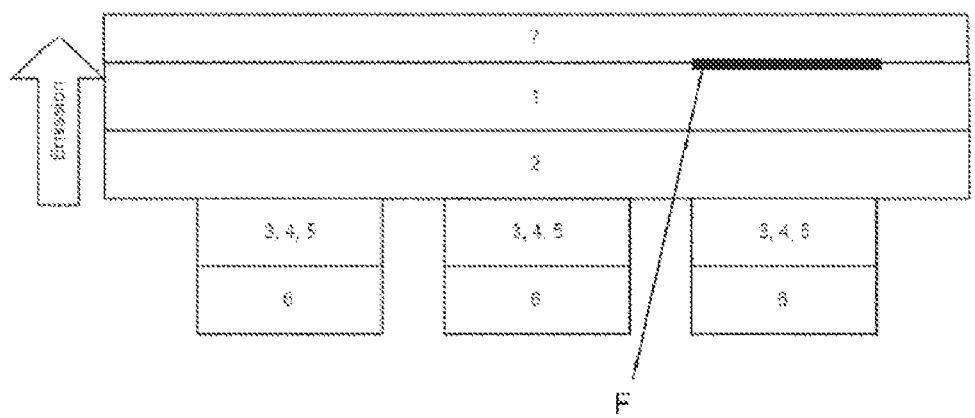
FIG. 2 the schematic diagram of a first embodiment of the method according to the invention.

Further, FIG. 2 shows the schematic diagram of a first embodiment of the method according to the invention which is based on the OLED construction according to FIG. 1. The method according to the invention for influencing the light propagation directions of at least one self-luminous or illuminated light-emitting surface F, which light-emitting surface F emits light of a first wavelength range $\Delta\lambda_1$ in a first spatial direction R1 and light of a wavelength range $\Delta\lambda_2$ at least partially differing from the first wavelength range $\Delta\lambda_1$ in a spatial direction R2 differing from the first spatial direction R1, and the wavelength ranges $\Delta\lambda_1$ and $\Delta\lambda_2$ have a wavelength-dependent spectral radiance and differ (but otherwise can also partially overlap) at least in a peak wavelength, and a switchable color converter 7 which, in the deactivated state, absorbs light of shorter wavelengths and at the same time transmits light of longer wavelengths and which, in the activated state, converts light of shorter wavelength into light of longer wavelengths and transmits light of longer wavelengths is arranged in front of the aforementioned light-emitting surface F with reference to viewing direction, the method comprising the following steps:

deactivating the color converter 7 for a first mode so that light of the second wavelength range $\Delta\lambda_2$ is transmitted and light of the first wavelength range $\Delta\lambda_1$ is absorbed, by means of which the light emanating from the light-emitting surface F is only perceptible from the second viewing direction R2, or activating the color converter 7 for a second mode so that light of the first wavelength range $\Delta\lambda_1$ is at least partially converted into light of the second wavelength range $\Delta\lambda_2$ and light of the second wavelength range $\Delta\lambda_2$ is transmitted, by means of which the light emanating from the light-emitting surface F is perceptible from both spatial directions R1, R2.

It should also be noted, without limiting generality, that the first wavelength range $\Delta\lambda_1$ is emitted in the first spatial direction R1 and the second wavelength range $\Delta\lambda_2$ is emitted in the second spatial direction R2. This association shall also apply in the following embodiments of the invention. It will be appreciated that the two spatial directions R1 and R2 could also be interchanged without departing from the scope of the invention.

The light-emitting surface F is represented by a bold black line (as sectional view) in FIG. 2. In reality, however, it has a surface area of a few square micrometers to, typically, some square millimeters. The light-emitting surface F is oriented perpendicular to the drawing plane of the schematic diagram.

Figure 3:
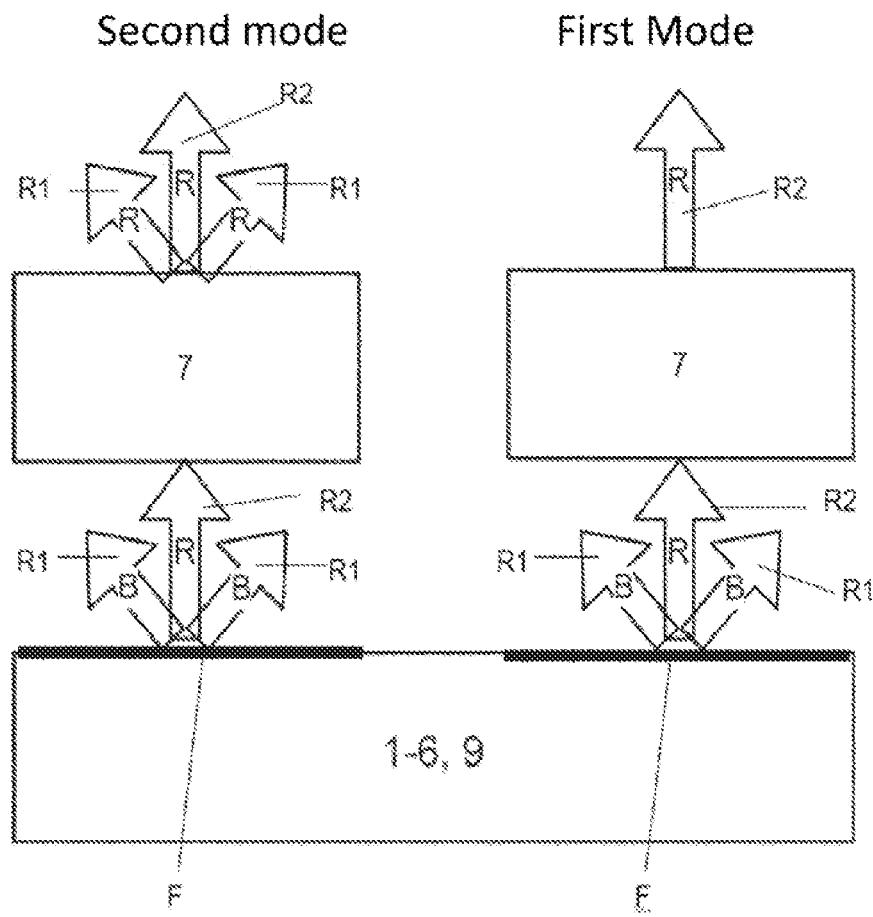
FIG. 3 the schematic diagram illustrating the manner of operation of the first embodiment of the method according to the invention shown in FIG. 2.

The schematic diagram illustrating the manner of operation of the first embodiment of the method according to the invention is shown in FIG. 3.

The color converter 7 is deactivated for the first mode (right-hand side) so that light of the second wavelength range $\Delta\lambda_2$ (denoted here by "R" for light with longer wavelength on average, for example, usually red light) is transmitted and light of the first wavelength range $\Delta\lambda_1$ (denoted here by "B" for light with shorter wavelength on average, for example, usually blue light) is absorbed, as a result of which the light proceeding from the light-emitting surface F is only perceptible from the (restricted) second spatial direction R2.

In contrast, the color converter 7 is activated for the second mode (left-hand side in FIG. 3) so that light of the first wavelength range $\Delta\lambda_1$ is converted into light of the second wavelength range $\Delta\lambda_2$ and light of the second wavelength range $\Delta\lambda_2$ is transmitted, as a result of which the light emanating from the light-emitting surface F is perceptible from both spatial directions R1, R2.

The switchable color converter 7 can preferably be formed by means of quantum dots. There is a multitude of quantum dots for each color converter. Each quantum dot can have, for example, a spatial extent of a maximum of 100 nm, preferably a maximum of 50 nm, particularly preferably a maximum of 20 nm. The switchable color converter 7 need not necessarily be connected with the substrate 1.

Of course, "spatial direction" R1 or R2 means a solid angle spreading out in one or two planes and comprising a few to some degrees in each plane. It is also possible that, e.g., a spatial direction R1 is outwardly cone-shaped, a second conical shape being cut out inside of this cone, for example, that of a second spatial direction R2, so that both spatial directions R1 and R2 together give a total conical shape. Correspondingly, a plurality of spatial directions together give a larger solid angle. The fact that the spatial directions R1 and R2 differ need not mean that they can also have a certain overlap. However, in the area of the overlap, the method described above does not afford an extensive influence on the propagation directions of the light emitted by the light- emitting surface F.

Semiconductor nanocrystals, for example, are contemplated as materials for the quantum dots, such as: CdSe, CdS, CdTe, ZnSe, ZnTe, ZnS, HgTe, InAs, InP, GaAs, GaP, GaInP 2, HgS, HgSe, HgTe, CdSeS, CdSeTe, CdSTe, ZnSeS, ZnSeTe, ZnSTe, HgSeS, HgSeT, CdZn CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSeS, HgZnSeSe, HgZnSeS, GaN, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInPAs, InAlNP, InAlNAs, and/or InAlPAs. It is also possible to use other types of quantum dots, e.g., graphenes, synthetic perovskites or silicon.

Figure 4:
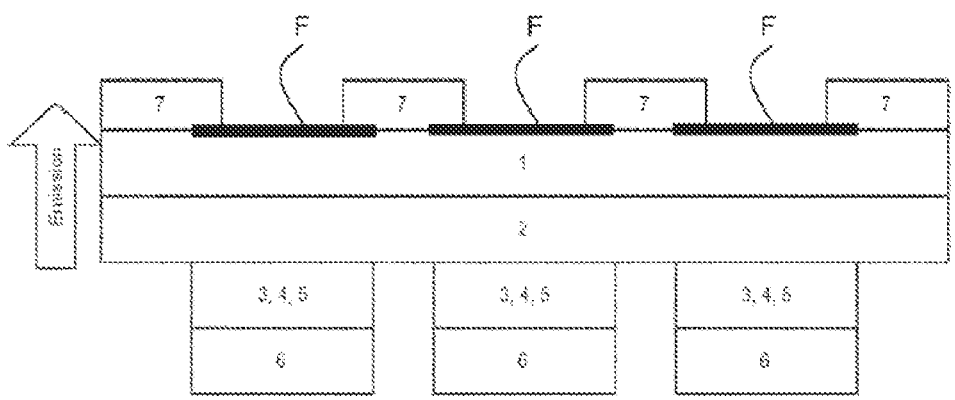
FIG. 4 the schematic diagram of a modification of the first embodiment of the method according to the invention shown in FIG. 2.

It may be helpful for particular configurations that the switchable color converter 7 does not cover the entire self-luminous or illuminated light-emitting surface F but rather only a strict subarea thereof. This is shown in FIG. 4.

Here the color converter 7 only partially overlaps the light-emitting surface F, namely at the edges. The color converter 7 is used for obliquely exiting light, but not for perpendicularly exiting light.

It is advantageous when the switchable color converter 7 is deactivated in the presence of an electric field and activated in the absence of an electric field.

Further, there is preferably provided a multitude of self-luminous light-emitting surfaces F, each of which corresponds to a smallest pixel of a QLED display, OLED display, mini-LED display, LED display or micro-LED display. Smallest pixels can be color subpixels (e.g., red, green, blue) or monochromatic pixels or full-color enabled pixels depending on the construction of the imaging device. Also contemplated are LCD-type, SED-type, FED-type or other types of display screen whose smallest pixels correspond to the multitude of illuminated or self-luminous light-emitting surfaces F.

Beyond this, it is possible that a distributed Bragg reflector (DBR) 9, a semitransparent mirror, additional emission layers and/or a waveplate are provided in the layer body of a smallest pixel of this kind so that, at least in the first spatial direction R1, light of the first wavelength range $\Delta\lambda_1$ is emitted instead of light of the second wavelength range $\Delta\lambda_2$. An additional element of this kind can also be switchable. A switchable DBR can be realized, for example, by means of liquid crystals or a phase-change material. It is important in this respect that the light of the second wavelength range $\Delta\lambda_2$ is collimated, i.e., limited to certain propagation directions R2.

Figure 5:
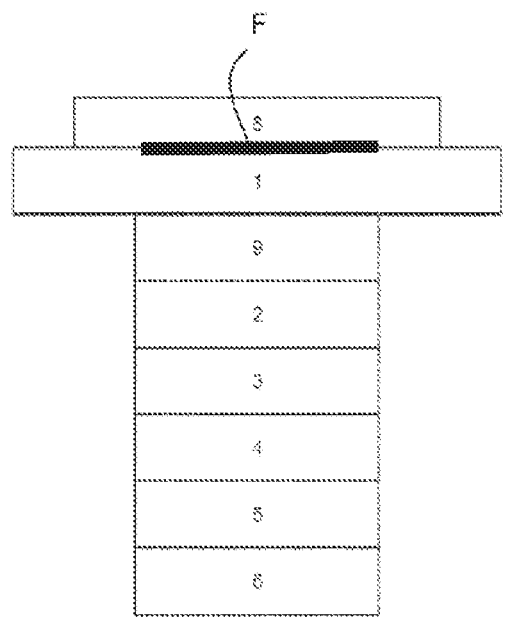
FIG. 5 the schematic diagram of a second embodiment of the method according to the invention.

Further, FIG. 5 shows the schematic diagram of a second embodiment of the method according to the invention. In this case, in a first mode, the aforementioned light-emitting surface F selectively emits light of a first wavelength range $\Delta\lambda_1$ in a first spatial direction R1 and light of a second wavelength range $\Delta\lambda_2$ at least partially differing from the first wavelength range $\Delta\lambda_1$ in a second spatial direction R2 differing from the first spatial direction, or, in a second mode, emits light at least of the second wavelength range $\Delta\lambda_2$ in both spatial directions R1, R2, the wavelength ranges $\Delta\lambda_1$ and $\Delta\lambda_2$ have a wavelength-dependent spectral radiance and differ (but otherwise can also partially overlap) at least in a peak wavelength or their peak wavelengths, and at least one color filter 8 which absorbs light of wavelength range $\Delta\lambda_1$ and transmits light of the wavelength range is arranged in front of the aforementioned light-emitting surface F with reference to viewing direction. In a particularly preferable manner, the light of wavelength range $\Delta\lambda_2$ is collimated in the first mode and not collimated in the second mode.

Proceeding therefrom, the second embodiment of the method according to the invention comprises the following steps:

activating the first mode in which light of the second wavelength range $\Delta\lambda_2$ after passing the color filter 8 is only perceptible from the second spatial direction R2, or activating the second mode in which light of the second wavelength range $\Delta\lambda_2$ after passing the color filter 8 is perceptible from both spatial directions R1, R2.

Figure 6:
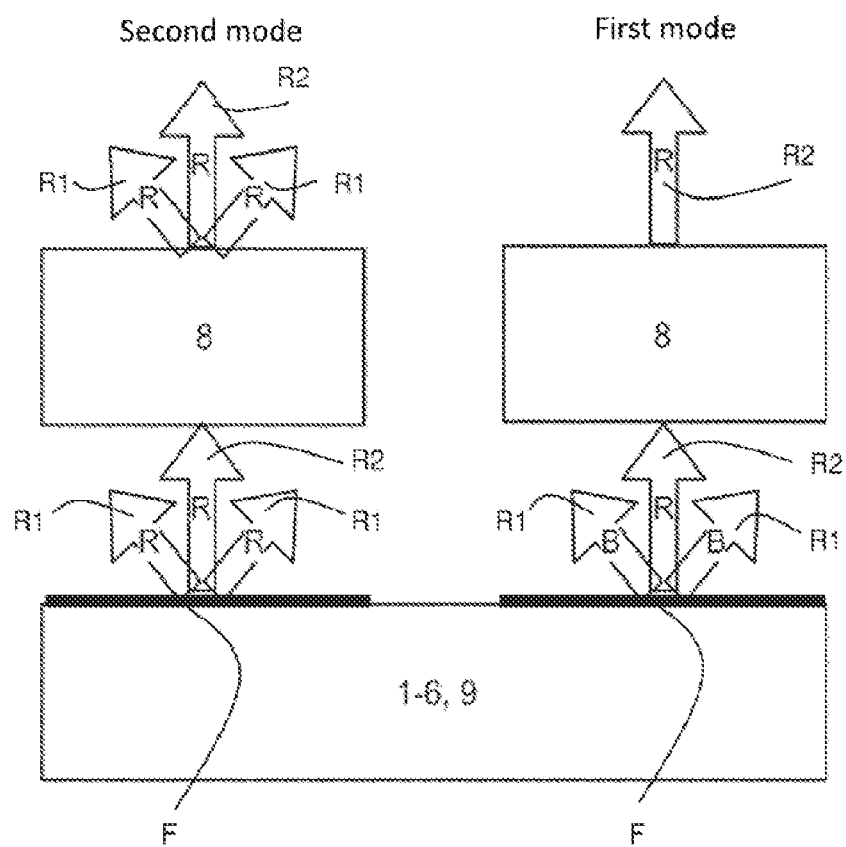
FIG. 6 the schematic diagram illustrating the manner of operation of the second embodiment of the method according to the invention shown in FIG. 5.

This manner of operation of the second embodiment of the method according to the invention is shown as schematic diagram in FIG. 6. When the first mode is activated (right-hand side in the drawing), light of the second wavelength range $\Delta\lambda_2$ (denoted here by "R" for light with longer wavelength on average) is transmitted and light of the first wavelength range $\Delta\lambda_1$ (denoted here by "B" for light with shorter wavelength on average) is absorbed, as a result of which the light emanating from the light-emitting surface F is perceptible after passing through the color filter 8 only from one spatial direction R2. On the other hand, if the second mode is activated so that light of the second wavelength range $\Delta\lambda_2$ is transmitted, the light emanating from the light-emitting surface F is perceptible from spatial directions R1, R2 after passing through the color filter 8 as is shown on the left-hand side in the drawing.

Further, a switchable DBR 9 (distributed Bragg reflector), a switchable mirror and/or a switchable waveplate can be provided in the layer body of every self-luminous or illuminated light-emitting surface F in the above-mentioned method variant according to FIG. 5 so that the emission of light of the first wavelength range $\Delta\lambda_1$ can be switched on and off.

The invention acquires special significance in the application of the above-described method for generating a first operating state B1 for a restricted viewing mode and a second operating state B2 for a public viewing mode in a display screen whose smallest pixels correspond to the aforementioned light-emitting surfaces F according to one of the method variants mentioned above, wherein for the first operating state B1 for a restricted viewing mode, a switchable color converter 7, if provided, is deactivated and/or a DBR (distributed Bragg reflector) 9, a switchable mirror or a waveplate, if provided, is activated, and for the second operating state B2 for a public viewing mode, a switchable color converter 7, if provided, is activated and/or a DBR (distributed Bragg reflector) 9, a switchable mirror or a waveplate, if provided, is deactivated.

Figure 7:
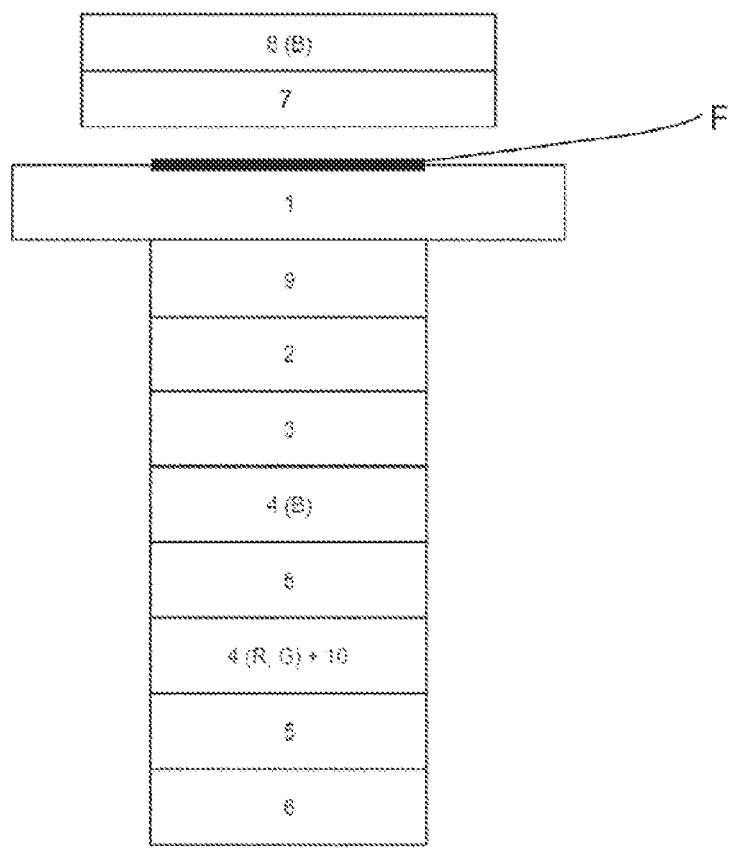
FIG. 7 the schematic diagram of a third embodiment of the method according to the invention.

Further, FIG. 7 shows the schematic diagram of a third embodiment of the method according to the invention. This is a further development of the second embodiment according to FIG. 5 in which the layer body contains various emissive layers 4 for R, G, B (red, green, blue) in order to obtain full color from a luminous light-emitting surface F. Accordingly, the first wavelength range $\Delta\lambda_1$ comprises red, green and blue spectral components. The light propagation direction are influenced in this case via (at least) one color converter 7 arranged in front of the substrate and one color filter 8 for light of shorter wavelength on average, i.e., the first wavelength range $\Delta\lambda_1$. The various emissive layers 4 (R, G, B for red, green and blue, respectively) in combination with the color converter 10 produce these three primary colors in a light-emitting surface F which is self-luminous in this instance.

In case of the use of full color, described above, two or three or possibly even more such color converters 7 or color filters 8 which are responsible for one or more peak wavelengths can be provided depending on the configuration.

Figure 8:
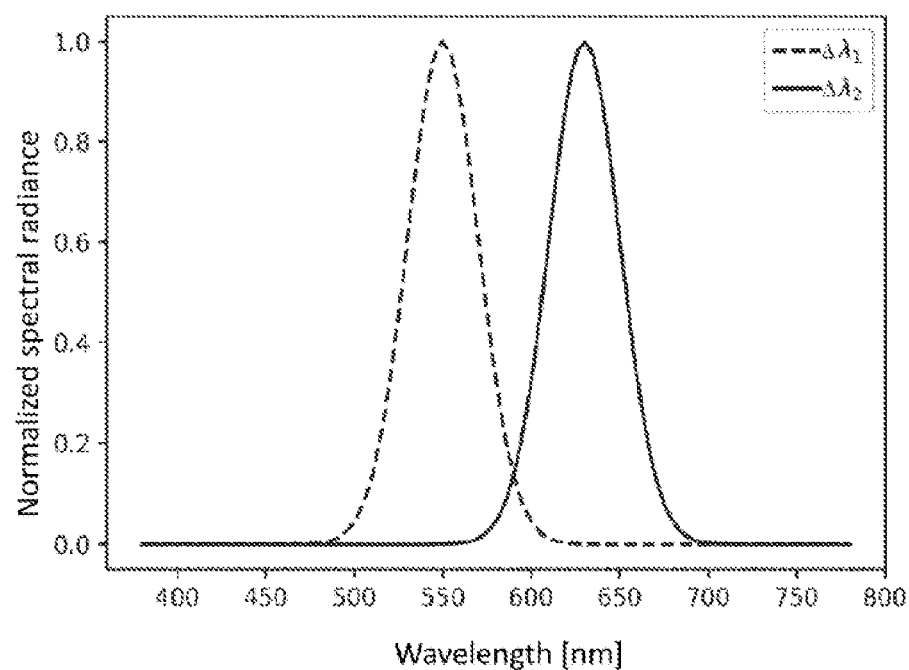
FIG. 8 an exemplary diagram for exemplary wavelength ranges $\Delta\lambda_1$ and $\Delta\lambda_2$.

Finally, FIG. 8 shows an exemplary diagram for exemplary wavelength ranges Ake and $\Delta\lambda_1$. It should be noted here once again that the wavelength ranges Ake and $\Delta\lambda_1$ can certainly have more wavelength peaks, although they must be pairwise disjoint.

The drawings described above can also be made use of in an analogous manner to illustrate the arrangements according to the invention which will not be described here in order to avoid redundancy.

The method according to the invention described above meets the above-stated object. A method and arrangement for influencing light propagation directions are described. The invention is particularly applicable to OLED pixels or OLED display screens and is capable of making possible operating modes for public view and restricted view. Further, the invention is inexpensively implementable and universally usable particularly with diverse types of display screen in order to make it possible to switch between a private viewing mode and a public viewing mode in such a way that the resolution of such a display screen is not significantly reduced.

The invention described above can advantageously be used in cooperation with an image display device anywhere that confidential data are displayed and/or entered, such as when entering a PIN number or displaying data on automatic teller machines or payment terminals or for entering passwords or when reading emails on mobile devices. The invention can also be applied in passenger cars when the driver's attention should not be drawn to distracting images. Further cases of application lie within the field of lighting and advertisement, in particular for preventing light pollution.

List of Reference Characters

1 substrate
2 semitransparent first electrode
3 organic layer
4 emissive layer
5 organic layer
6 mirror and electrode or reflective second electrode
7 color converter
8 color filter
9 DBR (distributed Bragg reflector)
10 color converter
F light-emitting surface

The invention claimed is:

1. A method for influencing the light propagation directions of at least one light-emitting surface, wherein the light-emitting surface emits light of a first wavelength range in a first spatial direction and light of a wavelength range at least partially differing from the first wavelength range in a spatial direction differing from the first spatial direction, wherein the first and second wavelength ranges have a wavelength-dependent spectral radiance and differ at least in a peak wavelength, and wherein at least one switchable color converter which, in the deactivated state, absorbs light of shorter wavelengths and at the same time transmits light of longer wavelengths and which, in an activated state, converts light of shorter wavelengths into light of longer wavelengths and transmits light of longer wavelengths, and is arranged in front of the light-emitting surface with reference to a viewing direction, the method comprising the following steps:

deactivating the color converter for a first mode so that light of the second wavelength range is transmitted and light of the first wavelength range is absorbed, such that the light emanating from the light-emitting surface is only perceptible from the second spatial direction, or activating the color converter for a second mode so that light of the first wavelength range is converted into light of the second wavelength range and light of the second wavelength range is transmitted, such that the light emanating from the light-emitting surface is perceptible from both the first and the second spatial directions.

2. The method according to claim 1, wherein the switchable color converter is formed by quantum dots, wherein each quantum dot has a spatial extent of a maximum of 100 nm.

3. The method of claim 2, wherein each quantum dot has a spatial extent of a maximum of 50 nm.

4. The method of claim 2, wherein each quantum dot has a spatial extent of a maximum of 20 nm.

5. The method according to claim 1, wherein the switchable color converter does not cover the entire light-emitting surface but rather only a subarea thereof.

6. The method according to claim 1, wherein the switchable color converter is deactivated in the presence of an electric field and activated in the absence of an electric field.

7. The method according to claim 1, wherein there is a multitude of self-luminous light-emitting surfaces, each of which corresponds to an emitting surface of a smallest pixel of a QLED display, OLED display, mini-LED display, LED display or micro-LED display, which smallest pixel is formed as a layer body.

8. The method according to claim 7, wherein, in the layer body of the smallest pixel there is at least one electro-optical component which changes an emitting characteristic of the light-emitting surface, by varying a resonance condition in the layer body, and which is formed as a distributed Bragg reflector (DBR), semitransparent mirror, waveplate, liquid crystal layer, electrochromic layer, electrowetting element, switchable absorber or as phase-change material so that, at least in the first spatial direction, light of the first wavelength range is emitted instead of light of the second wavelength range.

9. The method according to claim 1, wherein there is at least one pair of inner wavelength ranges within the first wavelength range and the second wavelength range for each of three primary colors red, green and blue for a full-color display, wherein for each pair of inner wavelength ranges, of two peaks in the spectrum which are separated by some nanometers to 200 nm, one peak lies in the first wavelength range and one peak lies in the second wavelength range.

10. An application of a method according to claim 1 for generating a first operating state for a restricted viewing mode and a second operating state for a public viewing mode in a display screen whose smallest pixels have electro-optical components and light-emitting surfaces, wherein the switchable color converter is deactivated for generating the first operating mode and is activated for generating the second operating mode.

11. An arrangement for influencing light propagation directions of at least one light-emitting surface, wherein the light-emitting surface emits light of a first wavelength range in a first spatial direction and light of a second wavelength range at least partially differing from the first wavelength range in a second spatial direction differing from the first spatial direction, wherein the first and second wavelength ranges have a wavelength-dependent spectral radiance and differ at least in a peak wavelength, further comprising at least one switchable color converter which, in a deactivated state, absorbs light of shorter wavelengths and at the same time transmits light of longer wavelengths and which, in an activated state, converts light of shorter wavelengths into light of longer wavelengths and transmits light of longer wavelengths, and is arranged in front of the light-emitting surface with reference to a viewing direction, wherein:

the color converter is deactivated for a first mode so that light of the second wavelength range is transmitted and light of the first wavelength range is absorbed, such that the light emanating from the light-emitting surface is only perceptible from the second viewing direction, and the color converter is activated for a second mode so that light of the first wavelength range is at least partially converted into light of the second wavelength range and light of the second wavelength range is transmitted, such that the light emanating from the light-emitting surface is perceptible from both the first and second spatial directions.

12. The arrangement according to claim 11, wherein the switchable color convertor comprises quantum dots.

* * * * *

UNITED STATES PATENT AND TRADEMARK OFFICE
CERTIFICATE OF CORRECTION

PATENT NO. : 11,829,051 B2
APPLICATION NO. : 17/759732
DATED : November 28, 2023
INVENTOR(S) : André Heber and Andreas Bregulla It is certified that error appears in the above-identified patent and that said Letters Patent is hereby corrected as shown below:

In the Specification

In Column 5, Line 62, delete "Ali" and insert -- $\Delta\lambda 1$ --, therefor.

In Column 6, Line 17, delete "Ali" and insert -- $\Delta\lambda 1$ --, therefor.

In Column 9, Line 45, delete "give" and insert -- gives --, therefor.

In Column 11, Line 54, delete "Ake" and insert -- $\Delta\lambda 2$ --, therefor.

In Column 11, Line 55, delete "Ake" and insert -- $\Delta\lambda 2$ --, therefor.

Signed and Sealed this
Twenty-sixth Day of March, 2024

Katherine Kelly Vidal
*Director of the United States Patent and Trademark Office*